(12) United States Patent
Haimerl

(10) Patent No.: US 6,914,328 B2
(45) Date of Patent: Jul. 5, 2005

(54) ELECTRONIC COMPONENT WITH AN INSULATING LAYER FORMED FROM FLUORINATED NORBORNENE POLYMER AND METHOD FOR MANUFACTURING THE INSULATING LAYERS

(75) Inventor: Alfred Haimerl, Sinzing (DE)

(73) Assignee: Infineon Technologies AG, Munich (DE)

( * ) Notice: Subject to any disclaimer, the term of this patent is extended or adjusted under 35 U.S.C. 154(b) by 130 days.

(21) Appl. No.: 10/060,447

(22) Filed: Jan. 30, 2002

(65) Prior Publication Data

US 2002/0103318 A1 Aug. 1, 2002

(30) Foreign Application Priority Data

Jan. 30, 2001 (DE) .......................................... 101 04 267

(51) Int. Cl.⁷ ...................... H01L 23/522; H01L 23/532
(52) U.S. Cl. ....................................... 257/700; 257/759
(58) Field of Search .............................. 257/506, 632, 257/635, 642, 700, 702, 759; 438/623, 780, 781

(56) References Cited

U.S. PATENT DOCUMENTS

| | | | |
|---|---|---|---|
| 3,330,815 A | | 7/1967 | McKeon et al. |
| 4,751,168 A | * | 6/1988 | Tsuchiya et al. ......... 430/272.1 |
| 5,177,166 A | | 1/1993 | Kobo et al. |
| 5,648,443 A | * | 7/1997 | Okamoto et al. ............ 526/281 |
| 6,031,058 A | | 2/2000 | McIntosh, III et al. |
| 6,184,572 B1 | * | 2/2001 | Mountsier et al. .......... 257/637 |
| 6,472,082 B2 | * | 10/2002 | Kodemura ................... 428/457 |
| 6,509,386 B1 | * | 1/2003 | Kohl ............................ 521/77 |
| 6,548,219 B2 | * | 4/2003 | Ito et al. ................... 430/270.1 |
| 2002/0103303 A1 | * | 8/2002 | Kodemura ................... 525/262 |

FOREIGN PATENT DOCUMENTS

| | | | | |
|---|---|---|---|---|
| EP | 936231 A1 | * | 8/1999 | ......... C08F/283/14 |
| WO | 98/18838 | | 5/1998 | |

OTHER PUBLICATIONS

Frank P. Alt et al.: Vinylic polymerization of bicyclo[2.2.1] hept–2–ene by Co (II)–catalysis, Macromol. Chem. Phys., vol. 199, 1998, No. 9, pp. 1951–1956.

* cited by examiner

Primary Examiner—Craig A. Thompson
Assistant Examiner—Jennifer M Dolan
(74) Attorney, Agent, or Firm—Laurence A. Greenberg; Werner H. Stemer; Ralph E. Locher

(57) ABSTRACT

An electronic component and a method of producing it, with at least one insulating layer is encompassed by the invention. The insulating layer includes a polymer including norbornene monomers. The polymer retains a double ring structure of the monomer $C_7H_{10}$ while there is breaking of a carbon double bond of the norbornene monomer. This breaking of the carbon double bond is created by a homopolymerization of the monomers to form crosslinked norbornene monomers with polar fluorocarbon bonds.

17 Claims, 7 Drawing Sheets

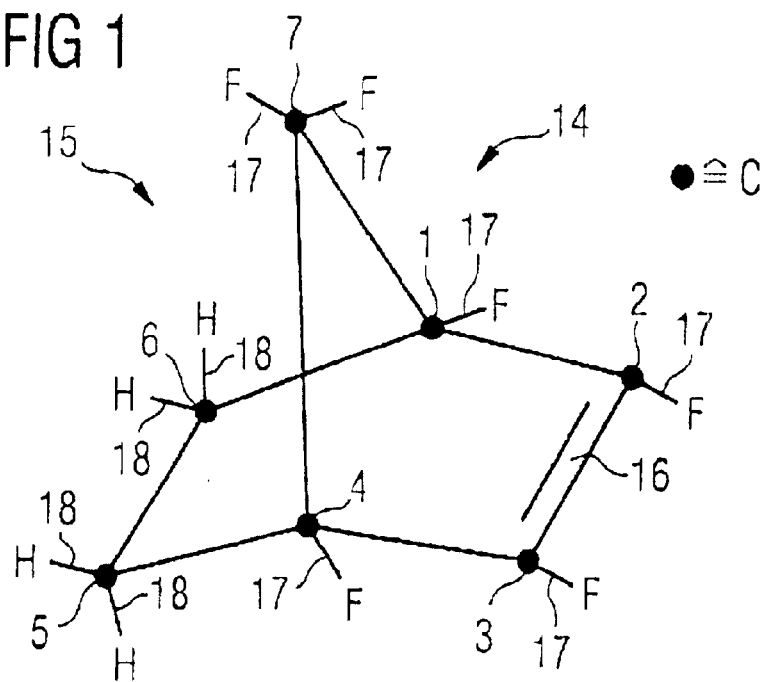
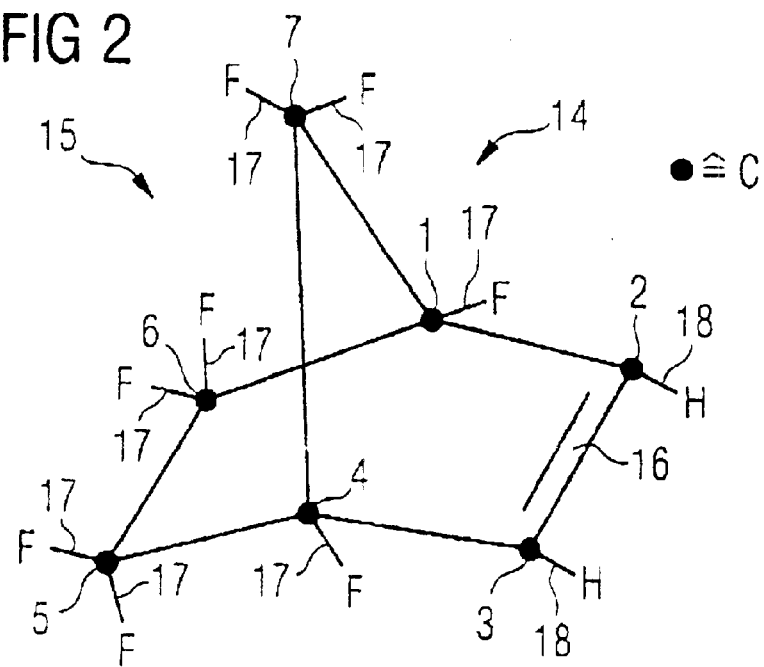

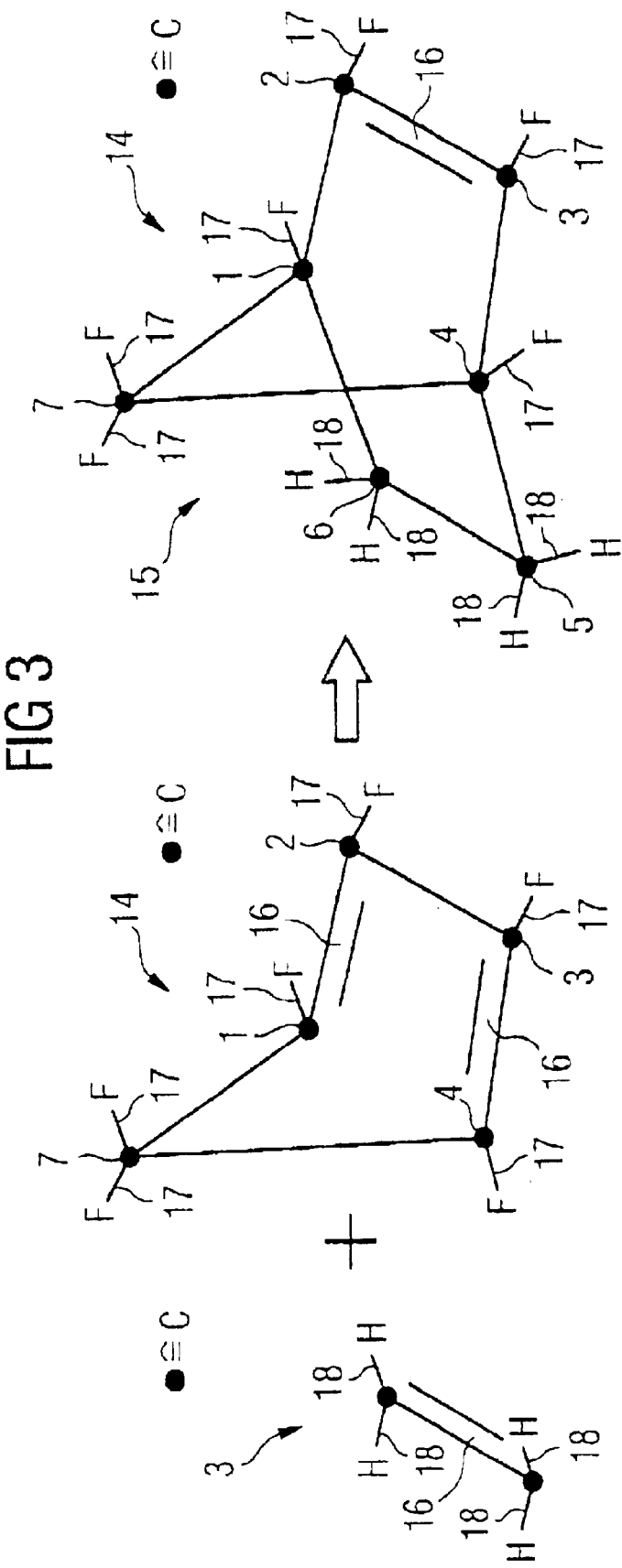

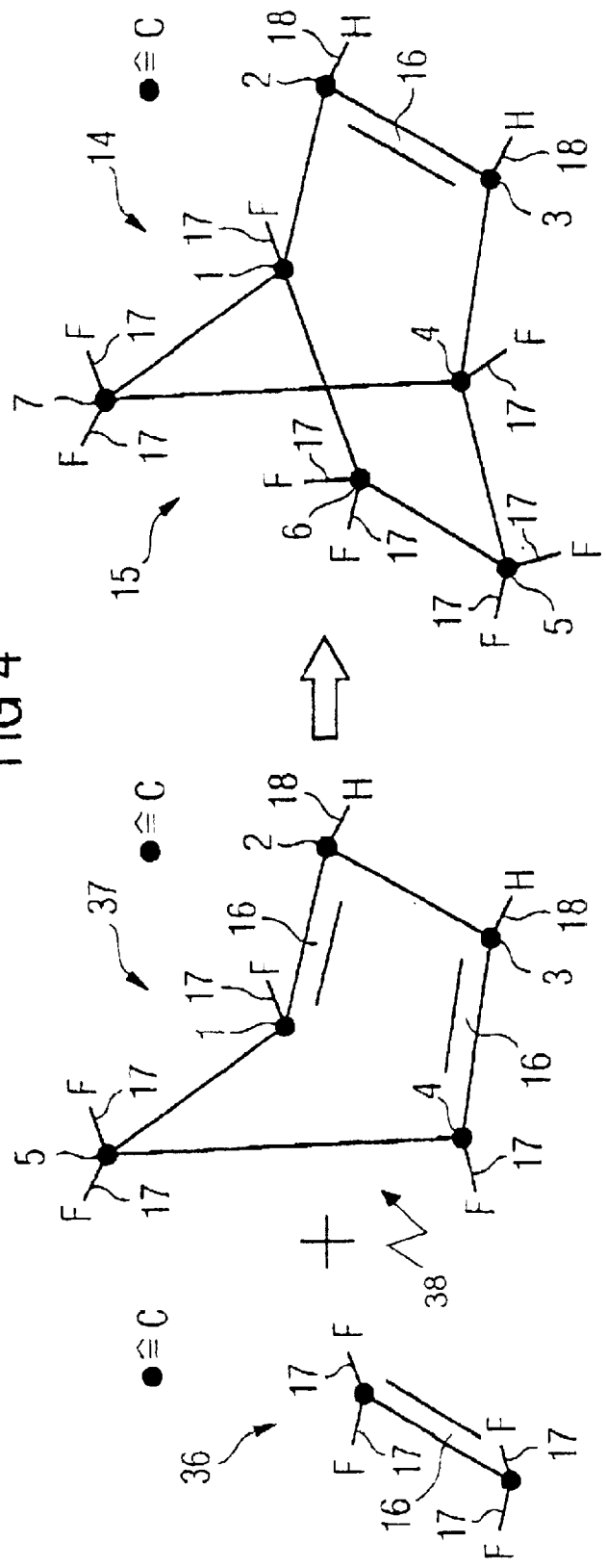

● ≅ C

ELECTRONIC COMPONENT WITH AN INSULATING LAYER FORMED FROM FLUORINATED NORBORNENE POLYMER AND METHOD FOR MANUFACTURING THE INSULATING LAYERS

BACKGROUND OF THE INVENTION

1. Field of the Invention

The invention relates to an electronic component with an insulating layer.

Electronic components can include an insulating layer. Insulating layers include plastics in addition to the purely inorganic insulating layers, such as silicon dioxide layers and silicon nitrite layers. In comparison with the inorganic insulating layers, these plastics have the disadvantage of a high relative dielectric constant. Consequently, they may not adequately suppress capacitive coupling effects between conductor tracks and also undesired noise effects and impair the function of electronic components.

2. Summary of the Invention

It is accordingly an object of the invention to provide an electronic component with an insulating layer formed from fluorinated norbornene polymer and a method for manufacturing the insulating layers that overcomes the hereinaforementioned disadvantages of the heretofore-known devices of this general type and that improves the function of electronic components with at least one insulating layer and provides insulating layers that change the relative dielectric constant to the needs and requirements of the electronic circuit of an electronic component.

With the foregoing and other objects in view, there is provided, in accordance with the invention, an electronic component having an insulating layer. The insulating layer has a polymer including norbornene monomers $C_7H_{10}$. The norbornene monomers have a double ring structure, carbon atoms at second and third positions, and carbon double bonds between the carbon atoms at the second and third positions. The polymer retains the double ring structure of the norbornene monomers by breaking the carbon double bonds between the carbon atoms of the second and third positions and has norbornene monomers crosslinked by homopolymerization with polar fluorocarbon bonds.

With the objects of the invention in view, there is also provided a method of producing an electronic component with an insulating layer having a polymer including norbornene monomers. The method includes partially fluorinating a starting material of a diene synthesis of norbornene monomers. The next step is preparing fluorinated norbornene monomers by diene synthesis from the partly fluorinated starting materials. The next step is homopolymerizing the fluorinated norbornene monomers under increased pressure and at increased temperature by breaking the carbon double bond between the carbon atoms of the second and third positions of the norbornene monomer to form polymer chains. The next step is processing the polymer chains by dissolving the polymer chains in organic solvents to form an insulating layer.

With the objects of the invention in view, there is also provided an additional method of producing an electronic component with an insulating layer having a polymer including norbornene monomers. The method includes preparing norbornene monomers by diene synthesis from cyclopentadiene and ethylene. The next step is fluorinating the norbornene monomers to a degree of fluorination between 10% and 100%. The next step is homopolymerizing the norbornene monomers under increased pressure and at increased temperature by breaking the carbon double bond between the carbon atoms of the second and third positions of the norbornene monomer to form polymer chains. The next step is processing the polymer chains by dissolving the polymer chains in organic solvents to form an insulating layer.

According to the invention, the electronic component with at least one insulating layer has a polymer including norbornene monomers. The polymer in this case retains the double ring structure of the monomer $C_7H_{10}$ while breaking the carbon double bond between the carbon atoms of the second and third positions of the norbornene monomer.

The norbornene monomers crosslinked by homopolymerization have polar fluorocarbon bonds. A plastic having norbornene monomers crosslinked by homopolymerization has the advantage that the relative dielectric constant can be tailored to the needs of electronic components, in particular, the insulating layers of these electronic components. The relative dielectric constant can be varied considerably by fluorination of the norbornene monomer and by homopolymerization crosslinkage to form an insulating layer by the substitution of hydrocarbon bonds by polar fluorocarbon bonds to give a relatively low dielectric constant. With the aid of fluorinated, homopolymerized polymers including norbornene monomers, relative dielectric constants for insulating layers down to the value 2.0 are achievable, and are variable within a low range of the relative dielectric constant between the values 2.0 and 4.0.

To achieve this variation of the dielectric constant, in one embodiment of the invention, the polymer including norbornene monomers has a degree of fluorination obtained by providing polar fluorocarbon bonds instead of hydrocarbon bonds of 10% to 100%. Consequently, at least every tenth hydrocarbon bond has been substituted by a polar fluorocarbon bond up to complete substitution (100%) of the hydrocarbon bonds by fluorocarbon bonds.

By varying fluorination, a variation of the relative dielectric constant for the polymer including norbornene monomers can be achieved. In addition, the adhesiveness of the plastic can be controlled, from a highly tacky composition to a scarcely wetting composition. The interrelationship between tackiness or adhesiveness and degree of fluorination is such that there is still outstanding and intensive adhesiveness at the lower limit of 10% of fluorination, while it is lost almost completely at complete fluorination (100%).

In a polymer including norbornene monomers for insulating layer electronic components, the polymer has a degree of fluorination obtained by providing polar fluorocarbon bonds instead of hydrocarbon bonds of 30% to 75%. At 30%, outstanding adhesive behavior is still ensured for this substance, but a reduced relative dielectric constant is already achievable. This dielectric constant is further reduced as the degree of fluorination increases up to 75%, and simultaneously the adhesive properties diminish. However, at a degree of fluorination of 75%, the adhesiveness of the plastic to inorganic protective and passivation layers of silicon dioxide and/or silicon nitrite and to the exposed metal surfaces is still intensive enough for it to be used for electronic components without having to introduce an adhesion-promoting layer between the inorganic layers or metal layers of a semiconductor chip and the insulating layers according to the invention.

A further embodiment of the invention provides that the polymer including norbornene monomers has a degree of fluorination obtained by providing polar fluorocarbon bonds instead of hydrocarbon bonds of 50% to 70%. This narrow band for the degree of fluorination can be achieved by suitable mixing of correspondingly pre-fluorinated norbornene monomers and subsequent homopolymerization to form crosslinked norbornene monomers. In this case, both the reduction of the relative dielectric constant and the adhesive effect of an insulating layer of a fluorinated polymer including norbornene monomers lie in a range that is of advantage for insulating layers in electronic components. Consequently, the relative dielectric constant can be reduced in stages by the gradual fluorination of the polynorbornene.

With the degree of fluorination of this embodiment, a relative dielectric constant can be covered by the dipole effect of the polar fluorocarbon bond down to the value 2.0 and combined with a required adhesive force, and optimized. In this case, the degree and position of the fluorination are decisive for adapting the desired property of a low relative dielectric constant and a simultaneously high adhesion for the needs of an insulating layer in an electronic component.

In a further embodiment of the invention, it is therefore provided for five to seven positions out of ten possible positions in the norbornene monomer for hydrogen atoms to be occupied by fluorine atoms and for the remaining three to five positions to be occupied by hydrogen atoms. At 60%, this degree of fluorination lies in the range of the last embodiment of the invention between 50% and 70%.

A further embodiment of the invention provides that at least the two carbon bonds of the seventh position in the norbornene monomer are substituted by polar fluorocarbon bonds. In the case of the previous embodiments, it was a matter of adapting the degree of fluorination to the needs of electronic components by making the sum of the fluorocarbon bonds and the sum of the hydrocarbon bonds lie within a fixed bandwidth. In the case of this further embodiment, it is a matter of defining the position of the fluorination within the double ring structure of the monomer. In this case, the seventh positions of the hydrocarbon bonds of the norbornene monomer are to be substituted by polar fluorocarbon bonds. The seventh position of the double ring structure of the norbornene monomer is an exposed stable position that is retained unchanged in the homopolymerization. It is not varied or changed during the polymerization like the positions two and three, which serve for the chain formation by breaking their double bond.

A further embodiment of the invention provides that six fluorine atoms are disposed on the first, second, third, fourth, and seventh positions and four hydrogen atoms occupy the fifth and sixth positions. In a way similar to the seventh position, the fifth and sixth positions within the double ring structure of the norbornene monomer are exposed positions that are not involved in the homopolymerization phase. Norbornene monomers of this type allow a fluorination of 60% to be achieved because six fluorine atoms occupy the norbornene double ring.

In a further embodiment of the invention, eight fluorine atoms occupy the first, fourth, fifth, sixth, and seventh positions of the norbornene double ring and only two hydrogen atoms occupy the second and third positions. This embodiment corresponds to a degree of fluorination of 80%, which consequently lies above the 70% and 75% of the previous embodiments. However, by mixing norbornene monomers in which the first, second, third, fourth and seventh positions are occupied by fluorine atoms with norbornene monomers in which the first, fourth, fifth, sixth, and seventh positions are occupied by fluorine atoms, any desired degree of fluorination between 60% and 80% can be set.

In a further embodiment of the invention, a plastic polymerized in this way is used as an insulating layer. In a further embodiment of the invention, norbornene-based plastic insulating layers of this type are used in electronic components for wiring planes and insulate wiring lines from the conductor tracks, which are disposed directly on a semiconductor chip. However, a polymer including norbornene monomers can also take the form of an insulating film, which by coating with a structured metal layer can likewise be used for a wiring film in electronic components. In particular in the case of the wiring films, a low relative dielectric constant is of great importance because two conductor track systems lie one above the other separated only by the insulating film that is on the one hand the conductor track system of the active upper side of the semiconductor chip and, on the other side of the insulating layer, the structured metallization for a wiring plane. A minimized relative dielectric constant consequently allows improved decoupling and an improved signal-to-noise ratio to be achieved for the electronic component. Crosstalk or other coupling effects can also be minimized in this way.

In a further embodiment of the invention, a wiring layer or wiring film may be disposed directly on a semiconductor wafer. The wiring film or the wiring layer on the semiconductor wafer has wiring lines. These wiring lines connect contact areas on the active upper side of the semiconductor wafer to external contacts on the wiring layer or wiring film of the electronic component. Polymers including norbornene monomers are ideally suited for providing an insulating layer on complete semiconductor wafers, which are the starting product for a number of electronic components. After subsequent metallization and forming of a wiring structure, the semiconductor wafer can be sawn up to produce electronic components. After the sawing, each component carries a wiring film including a polymer of the norbornene monomer.

On the other hand, in a further embodiment of the invention it is possible to provide each individual semiconductor chip that has been cut out from a semiconductor wafer with a wiring layer or a wiring film including a polymer of the norbornene monomer on its active upper side. If a wiring film is included, it can be adhesively bonded onto the semiconductor chip, while a screen printing method may be carried out for applying a wiring layer. The wiring conductor tracks in this case connect contact areas on the active upper side of a semiconductor chip to external contacts on the wiring layer or wiring film.

In a further embodiment of the invention, the wiring film has a plurality of layers of wiring conductor tracks including a metal and insulating layers containing a polymer of the norbornene monomer. These multiple wiring films are required whenever the wiring conductor tracks have to be packed so densely that crossunders and crossovers of wiring conductor tracks become necessary. For this purpose, a contact via is produced through the insulating layer including a polymer of the norbornene monomer to the wiring conductor tracks lying thereunder.

In the case of a further embodiment of the invention, it is provided that the relative dielectric constant of the insulating layer including a polymer of the norbornene monomers has a value between 2.0 and 2.4. That is a significant improvement in comparison with polyimides and other insulating layers because a value for the relative dielectric constant in the range from 2.0 to 2.4 is not achievable with polyimide or comparable materials.

A method of producing an electronic component with at least one insulating layer, the insulating layer having a polymer including norbornene monomers, has the following method steps:

fluorination of at least one of the starting products of the synthesis of norbornene monomers, preparation of the fluorinated norbornene monomer by diene synthesis from the fluorinated starting products, homopolymerization of the fluorinated norbornene monomers under increased pressure and at increased temperature and breaking of the carbon double bond between the carbon atoms of the second and third positions (2, 3) of the norbornene monomer to form polymer chains, processing of the polymer by utilizing its ready solubility in organic solvents to form at least one insulating layer of an electronic component.

This method has the advantage that, by fluorinating the norbornene monomer in a range of the degree of fluorination from 10% to 100%, on the one hand a very low relative dielectric constant can be achieved, provided that the degree of fluorination is increased to around 100%. At the same time, the adhesiveness of the plastic on inorganic substances such as silicon dioxide or silicon nitrite and also on metal can be adapted to the needs for electronic components, provided that the degree of fluorination is kept as low as possible. An optimum degree of fluorination for many applications therefore lies between 50% and 70%.

The ready solubility of the polymer in organic solvents can be used for processing the polymer to form films or deposited layers. In that, the polymer including fluorinated norbornene monomers is diluted with organic solvents in order to transform it into films by vaporizing the solvents. Consequently, very thin deposited layers in a thickness of a few micrometers, preferably 0.3 to 3 $\mu$m, can be achieved. In an example of how the method is conducted, the diluted polymer is applied to a semiconductor wafer by spin-coating or it is brought onto the semiconductor wafer by the immersion method.

An alternative method of producing an electronic component with at least one insulating layer, the insulating layer having a polymer including norbornene monomers, has the following method steps:

preparation of the norbornene monomer by diene synthesis from cyclopentadiene and ethylene $C_2H_4$, fluorination of the norbornene polymer to a degree of fluorination between 10% and 100%, homopolymerization of the norbornene monomers under increased pressure and at increased temperature and breaking of the carbon double bond between the carbon atoms of the second and third positions (2, 3) of the norbornene monomer to form polymer chains, processing of the polymer by utilizing its ready solubility in organic solvents to form at least one insulating layer of an electronic component.

In the case of this method, including a fluorination of the norbornene monomer, after its synthesis from cyclopentadiene and ethylene, the reference to a positional determination of the fluorine atoms in the monomer is slightly restricted in comparison with the above method. However, this has the advantage that the user can use synthesized norbornene monomers as a starting product in the fluorination.

The method of producing an electronic component may, furthermore, have the following method steps:

coating of the insulating layer including a polymer of norbornene monomers with a metal layer, structuring of the metal layer to form wiring conductor tracks with contact terminal areas at one end of the wiring conductor tracks on the insulating layer, and structuring of the insulating layer by opening at least one bonding channel, in which contact areas of an active upper side of a semiconductor chip are exposed.

With this method, an insulating layer for wiring conductor tracks is created in the semiconductor component. This overcomes the disadvantages of previous plastic insulating layers, with an extremely low relative dielectric constant. Improved decoupling of the signal transmission in the structured metal layer on the insulating layer including polymer of norbornene monomers and the structured metal layer on the semiconductor chip is achieved. The structured metal layer on the semiconductor chip has on its active upper side metallic and polysilicon conductor tracks, to connect electrodes of active and passive components of an integrated circuit to corresponding metallic contact areas on the semiconductor chips. The lower a relative dielectric constant can be made for a polymer layer of norbornene monomers of this type, the thinner the insulating layers can be applied, and consequently at the same time a reduction in the spatial expanse can be achieved in an advantageous way for the electronic component.

As already mentioned above, the use of appropriate organic solvents in which the polymer of norbornene monomers is readily soluble allows the insulating layer of a wiring layer to be applied directly to a semiconductor wafer by spraying and/or spin-coating. This has the advantage that a plurality of semiconductor chips can be coated with the insulating layer including a polymer of norbornene monomers simultaneously in a single processing step.

In a further example of how the method is conducted, a polymer layer of norbornene monomers can also be applied directly to a semiconductor wafer by the semiconductor wafer being immersed in an organic solution with dissolved polymer. An immersion method of this type has the advantage that, with an appropriate holding fixture, several hundred semiconductor wafers can be coated with a polymer layer of norbornene monomers at the same time.

After vaporizing of the solvent, a thin, and, if required, fine polymer layer of a thickness in the submicrometer range remains on the wafer, which then has to be provided with a structured metal layer as a wiring plane. A structured metal layer of this type can be applied by a printing technique and/or by physical depositing of the metal from the vapor phase onto the surface of the insulating layer. In the case of physical deposition, it is possible with one method step for a plurality of semiconductor wafers to be simultaneously coated with a metal layer, which is then subsequently structured by appropriate photolithography steps.

However, the polymer including norbornene monomers may also be used for a multi-ply layer including insulating layers and interposed wiring conductor tracks of structured metal layers. For this purpose, contact vias that connect the individual structured metal layers under one another or over one another are made in the insulating layers including a polymer of norbornene monomers.

In the case of a further example of how the method is completed, a structured insulating layer including a polymer of norbornene monomers is applied as a solder resist layer to the wiring layer with a structured metal layer. In this embodiment of the method, the wiring lines are protected against corrosion and against spreading of solder material by the polymer layer including norbornene monomers, which is used as a solder resist layer. Only the contact terminal areas of the wiring layer remain freely accessible. Contact terminals, for example solder balls, are subsequently applied to these freely accessible contact terminal areas of the wiring layer. This polymer layer including norbornene monomers then serves simultaneously as a package outer side of the semiconductor component.

Because the above method steps can be conducted both on an individually separated semiconductor chip and on a semiconductor wafer for a plurality of semiconductor chips, for the production of electronic components from a semiconductor wafer it is necessary for the latter finally to be separated into individual components.

These components may then be delivered directly to the customer or additionally coated on the rear side or on the edge sides with a plastics composition.

In a further example of how the method is conducted, the encapsulation with a plastics composition is completed before the contact terminals are applied to the contact terminal areas because the semiconductor chip with contact terminal areas but without a contact terminal represents a relatively planar supporting surface during the injection-molding of the rear side of the semiconductor chip and the edge regions of the semiconductor chip. Consequently, in the case of this method, the contact terminals are only applied, for example, by a process involving soldering solder balls on the contact terminal areas, after the semiconductor chip has been provided with a plastic package on the rear side and the edge sides.

To summarize, this results in the insulating layer according to the invention including a polymer of norbornene monomers and wiring planes with polymer layers that have a low relative dielectric constant. Although relative dielectric constants with values below 2 can be achieved with pure polytetrafluoroethylene such as that sold under the trademark TEFLON®. However, polytetrafluoroethylene is unsuitable as an insulating layer for use in electronic components because of its poor adhesion properties. Polytetrafluroethylene is unsuitable because polytetrafluoroethylene is known as a nonstick agent and consequently cannot be used directly as an adhering insulating layer in electronic components. Materials with good adhesion, such as polyimide or polybenzoxazole (PBO), however, lie with their relative dielectric constants of around 4 in a range that is accompanied by signal coupling problems and noise problems. By the gradual fluorination of polynorbornene, the value of the relative dielectric constant can be reduced in stages. The degree of fluorination allows coverage of a range for the relative dielectric constant that can also cover the part of technical interest, down to below 2.0, on account of the dipole effect of the polar fluorocarbon bonds. This property can be optimized in combination with the required adhesive force for insulating layers in an electronic component. The degree and position of the fluorination allows the desired property, that is, a low dielectric constant or improved adhesion, to be adapted in the application concerned.

Other features which are considered as characteristic for the invention are set forth in the appended claims.

Although the invention is illustrated and described herein as embodied in an electronic component with at least one insulating layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a structure diagram showing a first norbornene monomer for an insulating layer of an electronic component according to a first embodiment of the invention;

FIG. 2 is a structure diagram showing a second norbornene monomer for an insulating layer of an electronic component according to a second embodiment of the invention;

FIG. 3 are structure diagrams showing possible starting products of a norbornene monomer synthesis;

FIG. 4 are structure diagrams showing possible starting products for the synthesis of the norbornene monomer shown in FIG. 2;

DESCRIPTION OF THE PREFERRED EMBODIMENTS

Figure 5:
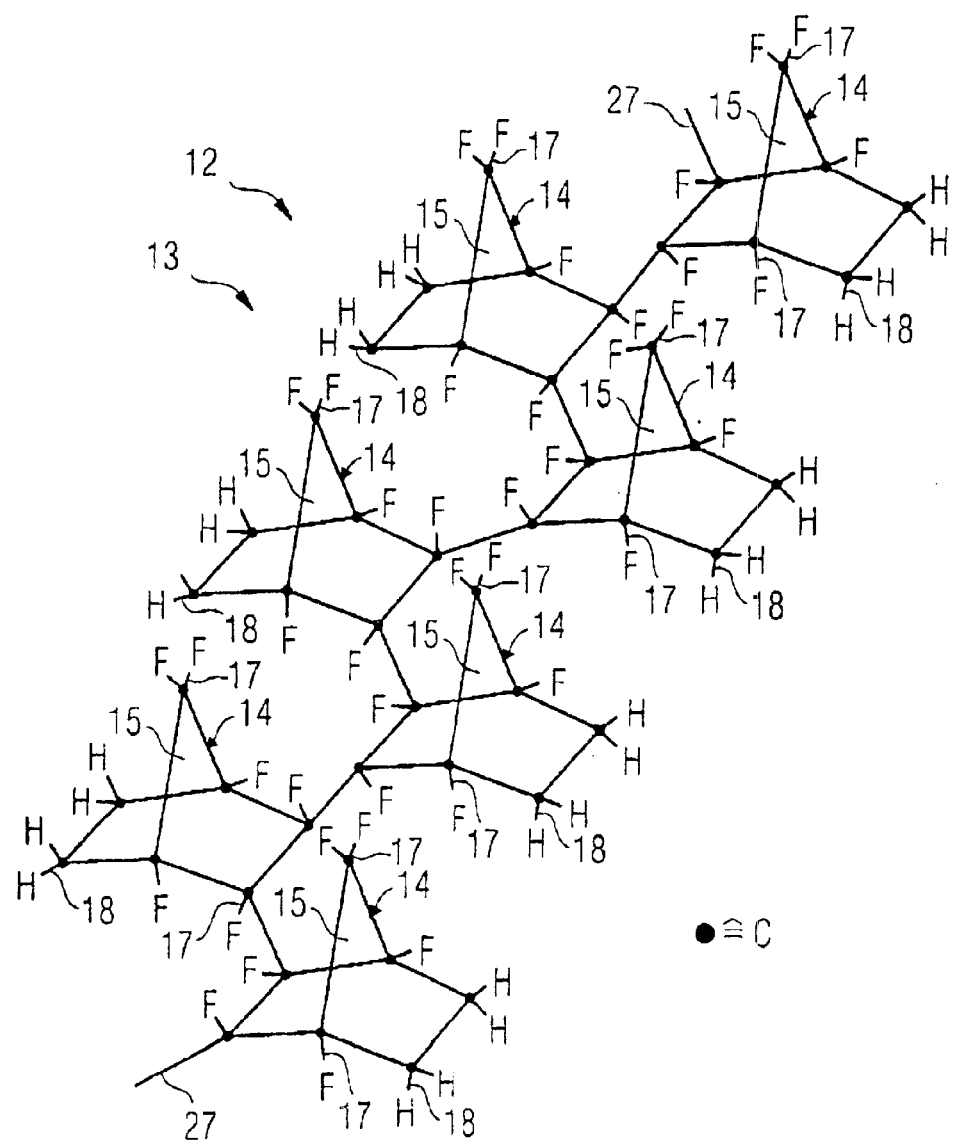
FIG. 5 is a structure diagram showing a polymer including norbornene monomers for an insulating layer of an electronic component according to the first embodiment.

Referring now to the figures of the drawings in detail and first, particularly to FIG. 1 thereof, there is shown a structure diagram of a first norbornene monomer 14 for an insulating layer of an electronic component according to a first embodiment of the invention. The norbornene monomer 14, as shown in FIG. 1, has a double ring structure 15 that is composed of two penta rings. This double ring structure 15 includes seven carbon atoms, correspondingly having seven structure positions 1 to 7. In this case, the seventh position 7 is an exposed position, which is occupied by two fluorocarbon bonds 17 in the case of the first, second and third embodiments of the invention. These polar fluorocarbon bonds 17 already reduce the relative dielectric constant.

If only the seventh position 7 is occupied by two polar fluorocarbon bonds 17, this corresponds to a degree of fluorination of 20% in the case of a homopolymerization on the basis of this monomer. If, however, a degree of fluorination of only 10% is to be achievable, the norbornene monomer with a degree of fluorination of 20% is mixed with a non-fluorinated monomer in a ratio of 1:1. The mixture is subsequently polymerized.

However, the monomer of FIG. 1 has a significantly higher degree of fluorination, because the positions one to four are also occupied by fluorocarbon bonds 17, so that only the positions five and six are occupied by a total of four hydrocarbon bonds 18, which corresponds to a degree of fluorination of 60%. A polymer which is formed by homopolymerization of this norbornene monomer of FIG. 1 has an adequate adhesiveness because of the remaining four hydrocarbon bonds 18 and has the advantage in comparison with a non-fluorinated norbornene monomer that the relative dielectric constant has a significantly lower value, which lies far below the value 4 of polyimide or polybenzoxazole.

The norbornene monomer of FIG. 1 has between the second and third positions 2 and 3 of the structure diagram a double bond 16, which permits a homopolymerization, i.e. a polymerization without additives or bridge radicals, with the effect of creating a long-chain molecule which has in its macroscopic property as an insulating layer not only a low dielectric constant in a range from 2 to 4, preferably between 2.0 and 2.4, but also a thermoplastic property. Consequently, by softening the polymer or by melting the polymer, the insulating layer can be applied to a semiconductor wafer or to a semiconductor chip. Repeated changing between the solid, softened and liquid state is possible in the case of such chain-like polymers or thermoplastics and improves the processability. In addition, a polymer including these norbornene monomers can be readily dissolved in organic solvents and consequently diluted to form low-viscosity lacquers, which can be applied in a thin layer to corresponding semiconductor chips or semiconductor wafers.

FIG. 2 shows a structure diagram of a second norbornene monomer 14 for an insulating layer of an electronic component of a second embodiment of the invention. Components with the same function as in FIG. 1 are identified by the same reference numerals and are not explained in any more detail. The difference between the monomer of the first embodiment and of the second embodiment is that the fifth and sixth positions 5 and 6 are likewise fluorinated, and in return for this the positions 2 and 3 between which the carbon double bond 16 is disposed are only respectively occupied by a hydrocarbon bond 18. It is also the case in this second embodiment that the seventh position 7 is occupied by two polar fluorocarbon bonds 17, so that the degree of fluorination of this monomer is 80%. Although the adhesion properties diminish somewhat, in return for this the dielectric constant can be further lowered and approaches that of polytetrafluoroethylene (PTFE), which however has the disadvantage that it is a non-stick agent. However, at least for insulating layers that on the one hand are intended to have good adhesion on inorganic insulating layers such as silicon dioxide and silicon nitrite and on the other hand are intended to permit good adhesion with respect to metal layers, a non-stick agent cannot be used. Providing the adhesiveness of the monomer according to FIG. 2 are the remaining hydrocarbon bonds in the second and third positions 2 and 3, between which there is at the same time a carbon double bond 6, which is broken during the homopolymerization and formation of polymer chains from these norbornene monomers 14.

FIG. 3 shows structure diagrams of possible starting products of a norbornene monomer synthesis. Components that have the same meaning as in FIGS. 1 and 2 are identified by the same reference numerals and are not explained in any more detail.

FIG. 4 shows structure diagrams of possible starting products for the synthesis of a norbornene monomer of FIG. 2 with a degree of fluorination of 80%. Components that have the same meaning as in the previous figures are identified by the same reference numerals and are not explained in any more detail. In this embodiment, completely fluorinated ethylene ($C_2F_4$) 36 and partly fluorinated cyclopentadiene ($C_5H_2F_4$) 37 are used as starting products of a diene synthesis, in which four of six hydrogen atoms (H) are substituted by fluorine atoms (F) of the penta ring 38. After the synthesis, the norbornene monomer 14 is obtained in a structure such as that shown in FIG. 2. This norbornene monomer 14 is 80% fluorinated.

FIG. 5 shows a structure diagram of a polymer including first norbornene monomers 14 for an insulating layer of an electronic component of the first embodiment of the invention. Since the monomer of FIG. 1 with a degree of fluorination of 60% has polar fluorocarbon bonds 17 in the positions two and three, between which a hydrocarbon double bond 16 simultaneously prevails, a polar fluorocarbon bond 17 will be respectively positioned between two monomers at each coupling point during the polymerization and consequently the breaking of this carbon double bond 16. This produces a chain of strung-together carbon atoms with fluorine bonds as shown in FIG. 3.

The polymer chain 27 can be lengthened as desired, without binders or connecting radicals having to be added during the homopolymerization, so that siliciding is not required for polymer formation either. The hydrocarbon bonds 18 of this polymer chain are far from the central polymer chain with fluorocarbon bonds 17, so that the polymer chain is enclosed by hydrocarbon bonds 18, whereby great adhesiveness can be achieved. The degree of fluorination of this polymer corresponds to the degree of fluorination of the monomer and, in this first embodiment of the invention, is 60%.

Figure 6:
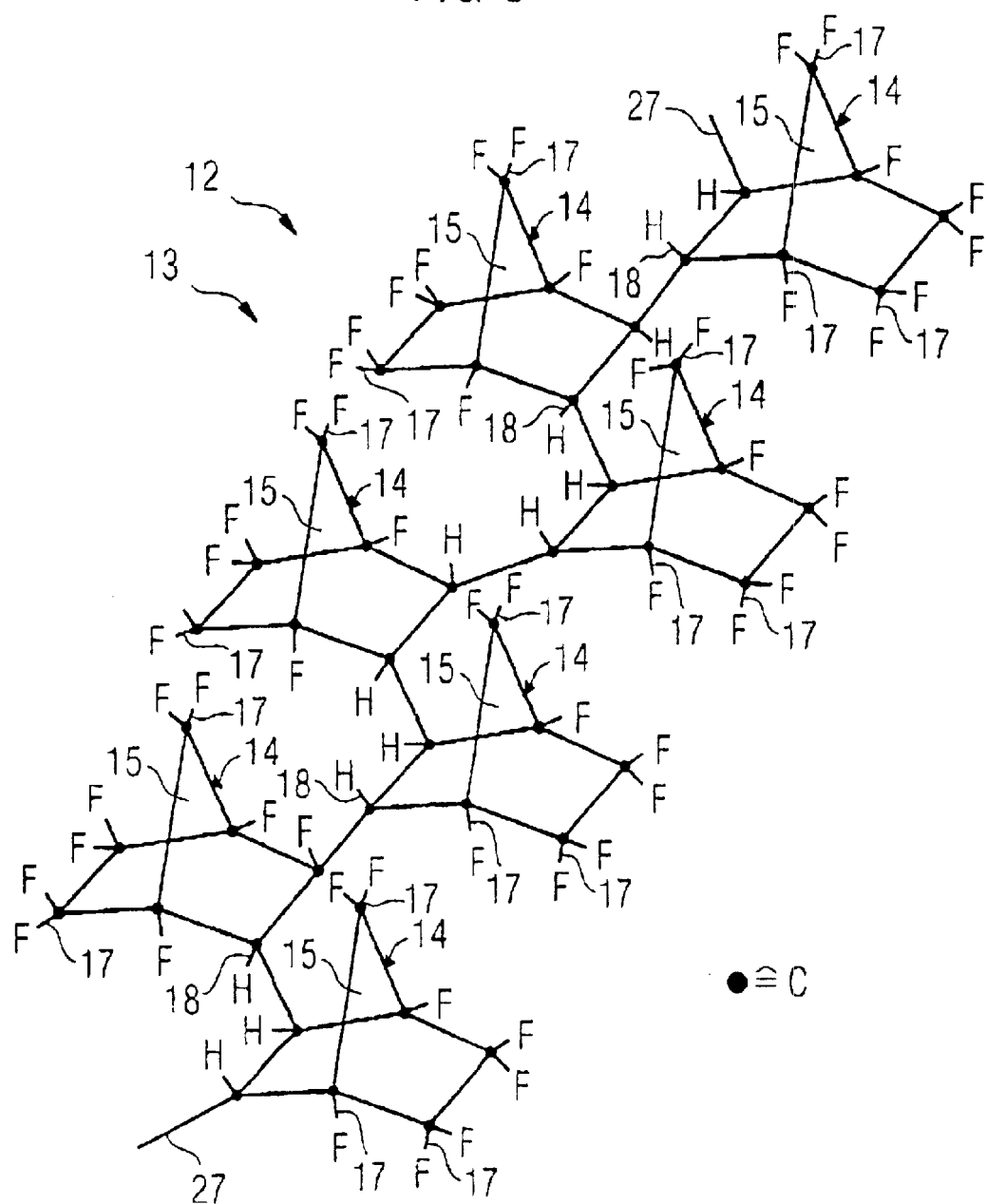
FIG. 6 is a structure diagram showing a polymer including norbornene monomers for an insulating layer of an electronic component according to a third embodiment.

FIG. 6 shows a structure diagram of a polymer 13 including norbornene monomers 14 of the second embodiment of the invention for an insulating layer of an electronic component. In the case of this embodiment of the invention, only the central polymerization chain 27 is occupied by hydrocarbon bonds 18. The spatially outer carbon atoms are all provided with fluorocarbon bonds 17, so that a low dielectric constant can be achieved with this polymer including norbornene monomers. However, the adhesion is greatly restricted, since the hydrocarbon bonds are concentrated on the central polymer chain 27 and are consequently restricted in their effect.

Figure 7:
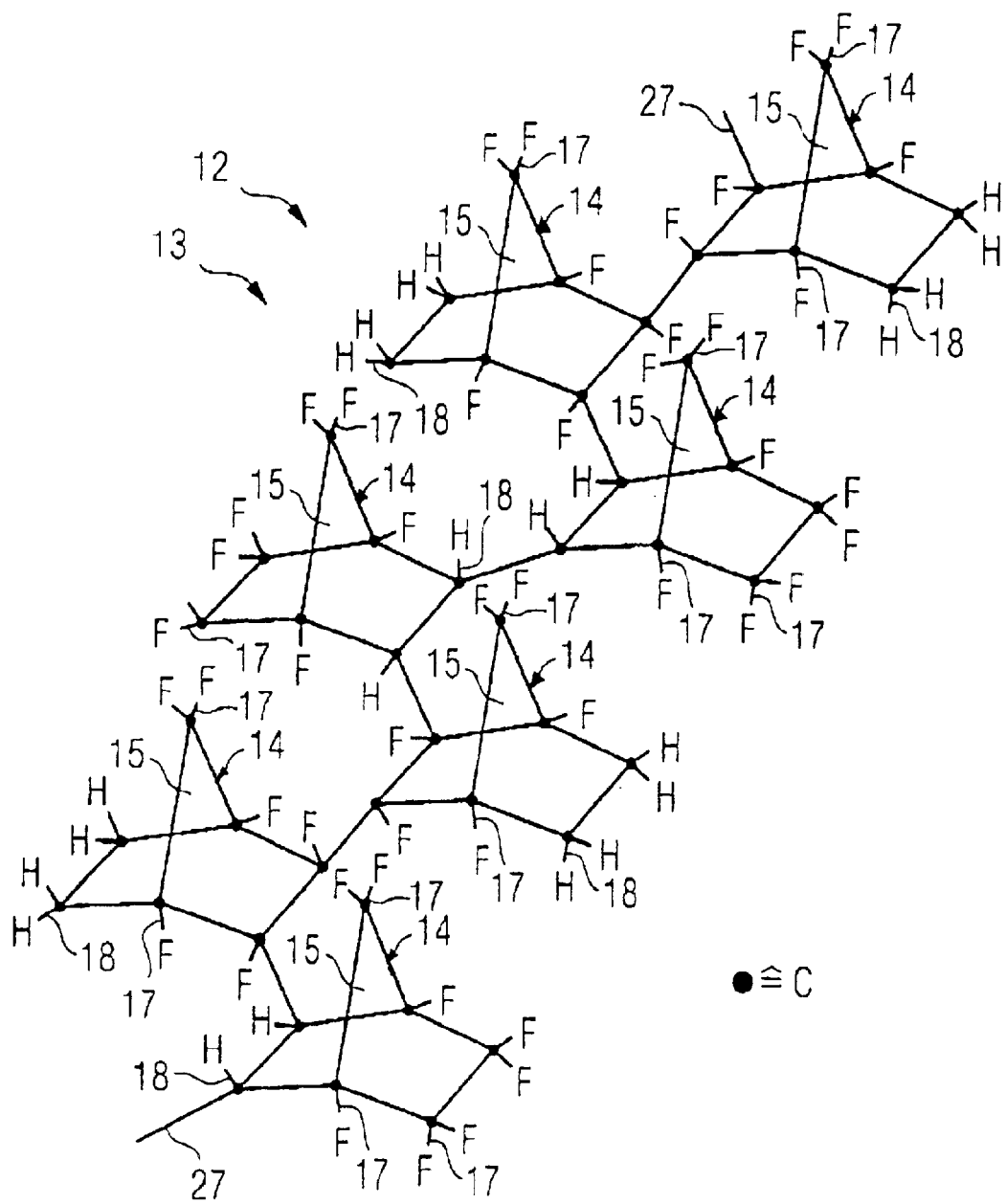
FIG. 7 is a structure diagram showing a polymer of norbornene monomers for an insulating layer of an electronic component of the third embodiment of the invention.

FIG. 7 shows a structure diagram of a polymer of norbornene monomers 14 for an insulating layer of an electronic component of a third embodiment of the invention. Components that perform the same functions as in the previous figures are identified by the same reference numerals and are not explained in any more detail. A polymer 13 of the third embodiment according to FIG. 5 can be formed by a monomer of the first embodiment of the invention being mixed with a monomer of the second embodiment of the invention in a ratio of 1:1 before polymerization. This mixing creates a configuration in which not all the outer positions of the polymer are occupied by fluorocarbon bonds but instead hydrocarbon bonds occur alternately in between, increasing the adhesiveness of the polymer chain. The degree of fluorination of this polymer lies between the degree of fluorination of the first and second embodiments and has a degree of fluorination of 70%. If a lower degree of fluorination is required for other applications, a greater proportion of non-fluorinated norbornene monomers can at any time be mixed in and used to reduce the degree of fluorination of the complete polymer chain. If higher degrees of fluorination than the 80% achievable with the second embodiment of the invention are desired, the polymer chain known from FIG. 4 or FIG. 5 must be supplemented by completely fluorinated monomers. The degree of fluorination for a polymer can be increased up to 100% if completely fluorinated norbornene monomers are used exclusively for the polymerization.

Figure 8:
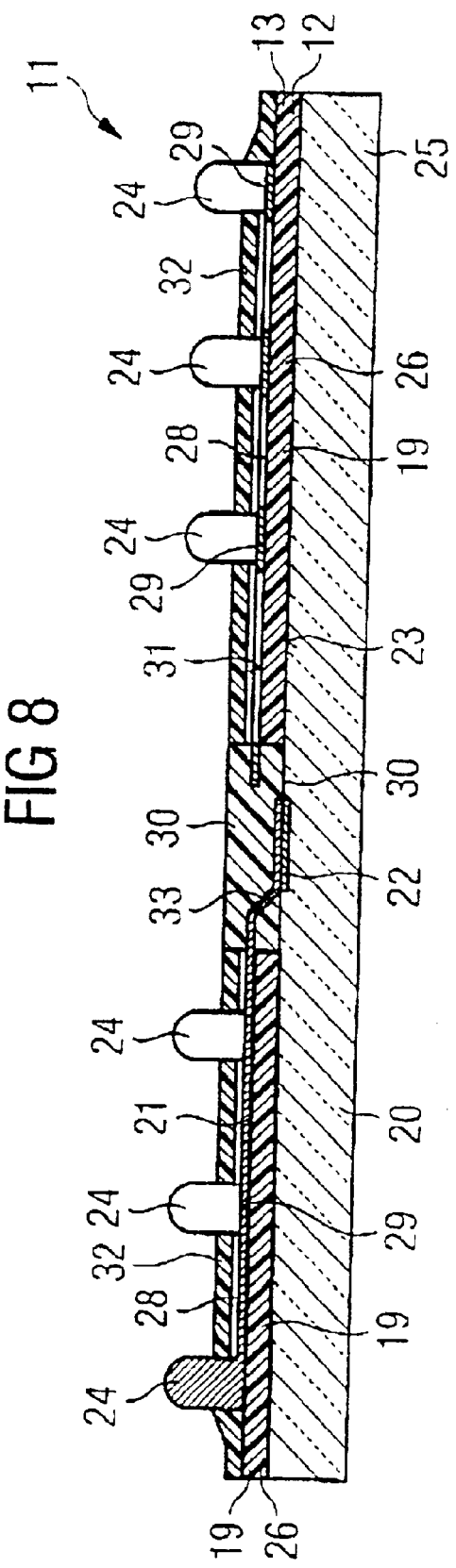
FIG. 8 is a partial schematic and partial diagrammatic cross-sectional view showing an electronic component with an insulating layer of a polymer including norbornene monomers.

FIG. 8 shows a schematic cross-sectional view of an electronic component 11 with an insulating layer 12 of a polymer 13 including norbornene monomers.

In FIG. 8, the reference numeral 20 designates a semiconductor wafer. The reference numeral 21 designates a wiring conductor track. The reference numeral 22 designates contact areas. The reference numeral 23 designates an active side of a semiconductor chip. The reference numeral 24 designates external contacts. The reference numeral 25 designates a semiconductor chip. The reference numeral 26 designates a wiring film. The reference numeral 28 designates a metal layer. The reference numeral 29 designates contact terminal areas. The reference numeral 30 designates a bonding channel.

In FIG. 8, on a semiconductor chip 25, an insulating layer 12 including a polymer of norbornene has been applied to the active upper side 23 of the semiconductor chip 25. The active upper side 23 of the semiconductor chip 25 has, in its center, contact areas 22. The contact areas 22 are disposed in a row within a bonding channel 30 on the active upper side 23. The contact window 30 is initially kept free of the insulating layer 12 including a polymer 13 of the norbornene monomers, so that an electrical connection 33 can be established between the contact area 22 and the wiring conductor tracks 21.

The insulating layer 12 insulates the conductor tracks (not shown) on the active upper side of the semiconductor chip 25 from the wiring conductor tracks 21 on the wiring film 26 or wiring layer 19. A metal layer 28 applied to the wiring layer 19 is structured in such a way that it has individual contact terminal areas 29, which are provided for external contacts 24. Between the contact terminal areas 29 and the contact areas 22 there is an electrical connection via the wiring conductor tracks 21. On account of the low dielectric constant of the insulating layer including a polymer of norbornene monomers along with adhesion properties at the same time, an electronic component like that shown by FIG. 8 can be created. Such an electric component avoids feedback between the conductor tracks on the active upper side 23 of the semiconductor chip 25 and the wiring conductor tracks 21 on the insulating layer 12.

I claim:

1. An electronic component, comprising:
   an insulating layer of a homopolymer including norbornene monomers $C_7H_{10}$;
   said norbornene monomers having a double ring structure, carbon atoms at second and third positions, and carbon double bonds between said carbon atoms at said second and third positions; and
   said polymer retaining said double ring structure of said norbornene monomers by breaking said carbon double bonds between said carbon atoms of said second and third positions and having norbornene monomers crosslinked by homopolymerization with polar fluorocarbon bonds.

2. The electronic component according to claim 1, wherein said polymer including norbornene monomers has a degree of fluorination of 10% to 100%, the degree of fluorination being obtained by providing polar fluorocarbon bonds instead of hydrocarbon bonds.

3. The electronic component according to claim 2, wherein said polymer including norbornene monomers has a degree of fluorination of 30% to 75%, the degree of fluorination being obtained by providing polar fluorocarbon bonds instead of hydrocarbon bonds.

4. The electronic component according to claim 3, wherein said polymer including norbornene monomers has a degree of fluorination of 50% to 70%, the degree of fluorination being obtained by providing polar fluorocarbon bonds instead of hydrocarbon bonds.

5. The electronic component according to claim 1, wherein five to seven positions out of ten possible positions in the norbornene monomer for hydrogen atoms are occupied by fluorine atoms and the remaining three to five positions are occupied by hydrogen atoms.

6. The electronic component according to claim 5, wherein at least two hydrocarbon bonds of the seventh position are substituted in the norbornene monomer by polar fluorocarbon bonds.

7. The electronic component according to claim 1, wherein six fluorine atoms occupy the first, second, third, fourth and seventh positions of the norbornene double ring structure and four hydrogen atoms occupy the fifth and sixth positions.

8. The electronic component according to claim 1, wherein eight fluorine atoms occupy the first, fourth, fifth, sixth and seventh positions of the norbornene double ring structure and two hydrogen atoms occupy the second and third positions.

9. The electronic component according to claim 1, wherein said insulating layer is a deposited insulating layer.

10. The electronic component according to claim 9, wherein said insulating layer is an insulating film.

11. The electronic component according to claim 1, wherein said insulating layer is a wiring layer.

12. The electronic component according to claim 11, wherein said wiring layer is a wiring film.

13. The electronic component according to claim 12, wherein said wiring film has a plurality of layers of wiring conductor tracks, said conductor tracks being formed of metal and insulating layers including a polymer of said norbornene monomer.

14. The electronic component according to claim 11, including:
   a semiconductor wafer having an active side and contact areas on said active side;
   external contacts being disposed on said wiring layer; and
   wiring conducting tracks being disposed on said wiring layer electrically connecting said contact areas on said active side of said semiconductor wafer to said external contacts on said wiring layer.

15. The electronic component according to claim 11, including:
   a semiconductor chip having an active side and contact areas on said active side;
   external contacts being disposed on said wiring layer; and
   wiring conductor tracks electrically connecting said contact areas on said active side of said semiconductor chip to said external contacts on said wiring layer.

16. The electronic component according to claim 1, wherein said insulating layer including said polymer of said norbornene monomers has a relative dielectric constant between 2.0 and 2.4.

17. An electronic component including: a semiconductor chip having an active side and contact areas on said active side;

at least one rewiring layer disposed on said active side of said semiconductor chip, said at lest one rewiring layer including:

an insulating layer of a homopolymer including norbornene monomers $C_7H_{10}$;

said norbornene monomers having a double ring structure, carbon atoms at second and third positions, and carbon double bonds between said carbon atoms at said second and third positions;

said polymer retaining said double ring structure of said norbornene monomers by breaking said carbon double bonds between said carbon atoms of said second and third positions and having norbornene monomers crosslinked by homopolymerization with polar fluorocarbon bonds; and a structured metal layer including contact terminal areas and wiring cnductor tracks disposed on said polymer layer;

external contacts being disposed on said contact terminal areas of said wiring layer;

said wiring conductor tracks electrically connecting said contact areas on said active side of said semiconductor chip to said external contacts;

a structured insulating layer including said polymer of norbornene monomers disposed on said wiring conductor tracks of said rewiring layer, said contact terminal areas of the rewiring layer remaining free from said polymer layer, the polymer layer being an outer package side of the electronic component.

* * * * *